United States Patent [19]
Hofmeister

[11] Patent Number: 6,002,840
[45] Date of Patent: Dec. 14, 1999

[54] SUBSTRATE TRANSPORT APPARATUS

[75] Inventor: Christopher A. Hofmeister, Hampstead, N.H.

[73] Assignee: Brooks Automation Inc., Chelmsford, Mass.

[21] Appl. No.: 08/941,444

[22] Filed: Sep. 30, 1997

[51] Int. Cl.[6] .................................................. G05B 15/00
[52] U.S. Cl. .......................... 395/80; 395/88; 364/167.03; 414/730; 901/30; 901/46
[58] Field of Search .................. 364/167.03, 167.04, 364/167.05, 167.06; 395/80, 88, 89, 93, 94; 414/730, 935–941, 732–735, 754, 783; 901/46, 47, 30, 31, 32; 702/150

[56] References Cited

U.S. PATENT DOCUMENTS

| | | |
|---|---|---|
| 4,715,921 | 12/1987 | Maher et al. ............................ 156/345 |
| 4,980,971 | 1/1991 | Bartschat et al. ...................... 901/47 X |
| 5,004,399 | 4/1991 | Sullivan et al. ...................... 414/737 X |
| 5,224,809 | 7/1993 | Maydan et al. ...................... 414/732 X |
| 5,431,529 | 7/1995 | Eastman et al. ...................... 414/744.5 |
| 5,483,138 | 1/1996 | Shmookler et al. .................... 318/560 |
| 5,497,007 | 3/1996 | Uritsky et al. ....................... 250/491.1 |
| 5,512,320 | 4/1996 | Turner et al. ........................... 427/255 |
| 5,537,311 | 7/1996 | Stevens .............................. 364/167.01 |
| 5,563,798 | 10/1996 | Berken et al. ...................... 364/478.06 |

*Primary Examiner*—William Grant
*Assistant Examiner*—Sheela S. Rao
*Attorney, Agent, or Firm*—Perman & Green, LLP

[57] ABSTRACT

A substrate transport apparatus comprising a robot transport arm and a substrate aligner located on the robot transport arm.

11 Claims, 2 Drawing Sheets

SUBSTRATE TRANSPORT APPARATUS

BACKGROUND OF THE INVENTION

1. Field of the Invention

The present invention relates to a substrate transport apparatus and, more specifically, to a substrate transport apparatus with a substrate aligning system.

2. Prior Art

Various types of substrate aligning systems are known in the prior art. Examples of substrate aligning systems are disclosed in U.S. Pat. Nos. 5,537,311; 5,483,138; 5,497,007 and 5,563,798.

SUMMARY OF THE INVENTION

In accordance with one embodiment of the present invention a substrate transport apparatus is provided. The substrate transport apparatus comprises a robot transport arm and a substrate aligner located on the robot transport arm.

In accordance with another embodiment of the present invention a substrate transport apparatus is provided comprising a robot transport arm and means for aligning the substrate. The robot transport arm has an end effector to hold the substrate. The means for aligning the substrate aligns the substrate relative to the transport arm while the substrate is being held by the end effector.

In accordance with another embodiment of the present invention, a substrate transport apparatus is provided comprising a robot transport arm and an end effector. The end effector is located on the robot transport arm. The end effector has a rotatable chuck to rotatably hold the substrate thereon. The robot transport arm has a sensor to detect an edge of the substrate.

In accordance with one method of the present invention, a method is provided for moving a substrate on a robot transport arm when the arm is being moved. The method comprises the steps of holding the substrate on the robot transport arm, moving the robot transport arm and rotating the substrate relative to the robot transport arm.

In accordance with another method of the present invention, a method is provided for aligning a substrate when the substrate is being moved from a first location to a second location. The method comprises the steps of capturing the substrate at the first location with a robot transport arm, moving the substrate with the robot transport arm from the first location to the second location, and aligning the substrate by rotating the substrate relative to the robot transport arm when the substrate is being moved from the first to the second location.

In accordance with another embodiment of the present invention, a substrate transport apparatus is provided comprising a robot transport arm, means for rotatably moving a substrate, and a computer controller. The robot transport arm has an end effector to hold the substrate. The means for rotatably moving the substrate rotatably moves the substrate on the end effector. The computer controller controls the rotation of the substrate on the end effector.

BRIEF DESCRIPTION OF THE DRAWINGS

The foregoing aspects and other features of the present invention are explained in the following description, taken in connection with the accompanying drawings, wherein.

DETAILED DESCRIPTION OF THE PREFERRED EMBODIMENT

Figure 1:
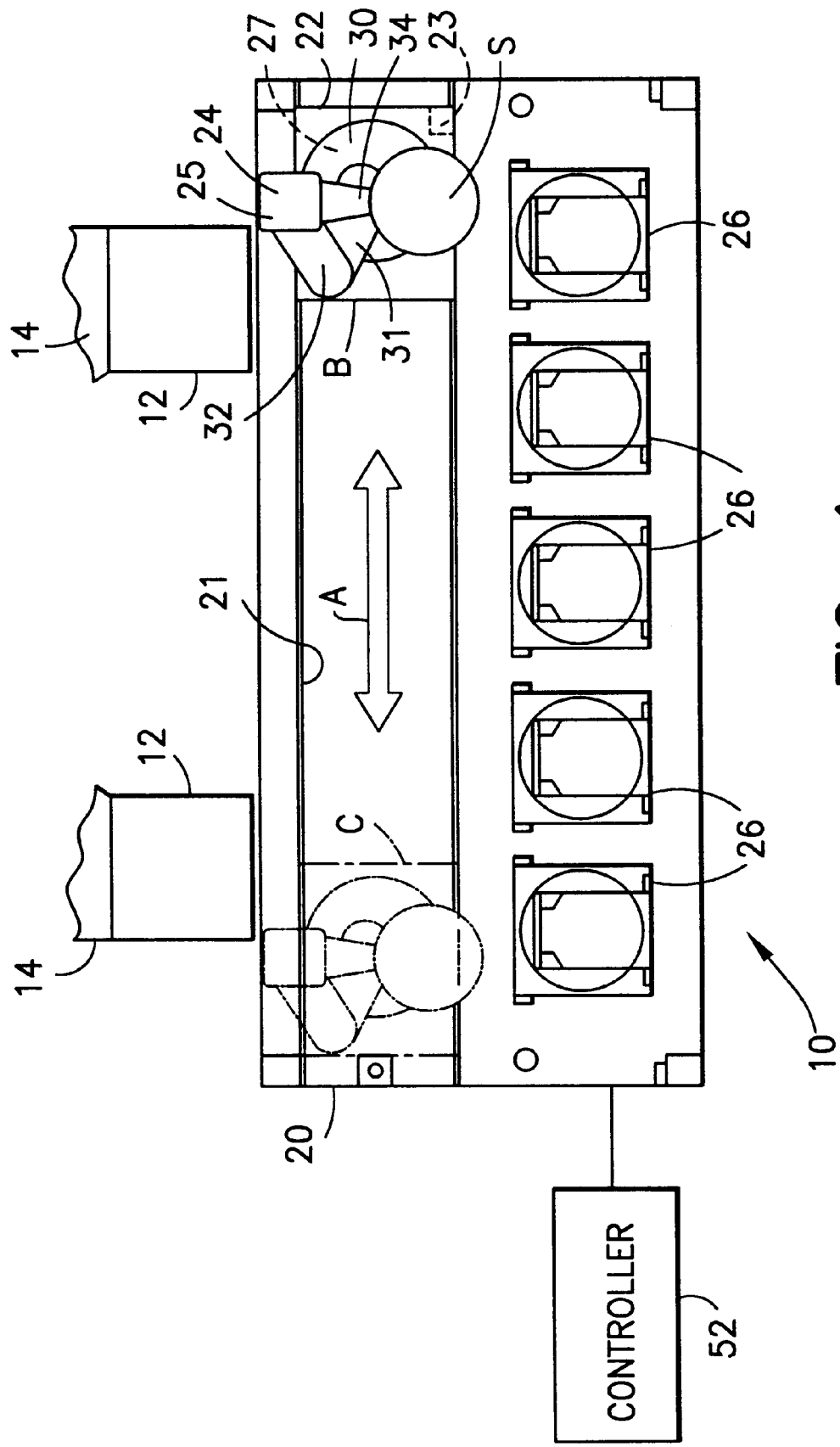
FIG. 1 is a schematic top plan view of an apparatus incorporating features of the present invention for transporting substrates into and out of a processing device.

Referring to FIG. 1, there is shown a schematic top plan view of an apparatus 10 incorporating features of the present invention. Although the present invention will be described with reference to the single embodiment shown in the drawings, it should be understood that the present invention can be embodied in many different alternate forms of embodiments. In addition, any suitable size, shape or type of elements or materials could be used.

The apparatus 10 is shown connected to load locks 12 of a substrate processing device 14. The processing device 14 is adapted to process substrates such as semiconductor wafers as is known in the art. Examples of substrate processing devices are described in U.S. Pat. Nos. 4,715,921 and 5,512,320 which are hereby incorporated by reference in their entireties. In alternate embodiments, the apparatus 10 could be configured to work with any suitable type of substrate processing device. The apparatus 10 generally comprises a frame 20, a car 22, a robot 24, and substrate cassettes 26. The apparatus 10 is adapted to move substrates, such as semiconductor wafers or flat panel display substrates, between the cassettes 26 and the load locks 12. The apparatus 10 employs the robot 24 to individually remove substrates from the cassettes 26, aligns the substrates to suite the processes that will be applied in the substrate processing device 14, and inserts the substrates into the load locks 12. When the processing device 14 finishes processing the substrates, the apparatus 10 is used to return the substrates from the load locks 12 to the cassettes 26. The apparatus 10 operates in atmospheric pressure, but could be used in other pressure situations, including a vacuum. The apparatus 10 is adapted to hold a number of the cassettes 26.

The frame 20 is adapted to removably support the cassettes 26 thereon. The cassettes 26 are well known in the art, such as cassettes that hold thirteen or twenty-six semiconductor wafers. The frame 20 is fixedly attached to the front ends of the load locks 12. The car 22 is movably mounted on the track area 21 of the frame to move or roll between positions B and C along pathway A. A car drive mechanism 23 drivingly connects the car to the frame 20 to controllably move the car 22 to different positions along the track area 21. One such car drive mechanism is described in U.S. patent application Ser. No. 08/891,523, filed Jul. 11, 1997 entitled "Robot Arm Relocation System" which is hereby incorporated by reference in its entirety. In alternate embodiments other types of robot arm relocation systems could be used or, alternately, the robot arm could be rotatably mounted on a single axis of rotation, such as inside the main substrate transport chamber of the substrate processing device 14.

The robot 24 is mounted to the car 22. Thus, the robot 24 moves with the car 22. The robot 24 generally comprises a movable arm assembly 25 and a drive system 27. The drive system 27 is connected to the movable arm assembly 25 to operably extend and retract the arm assembly 25. The arm assembly 25 is shown in a retracted position in FIG. 1. When the arm assembly 25 is extended it can have its end effector positioned inside the load locks 12 or cassettes 26 to pick-up or drop-off a substrate. In the embodiment shown, the arm assembly is a scara arm assembly, such as disclosed in U.S. Pat. No. 5,431,529 or U.S. Pat. No. 5,765,983 which are hereby incorporated by reference in their entireties. The arm assembly 25 has three arm sections connected in series including an upper arm 31, a forearm 32, and an extended wrist 34. The upper arm 31 is connected to the drive system 27. The extended wrist 34 is connected to the upper arm 31 by the forearm 32 and includes an end effector section at its distal end.

Figure 2:
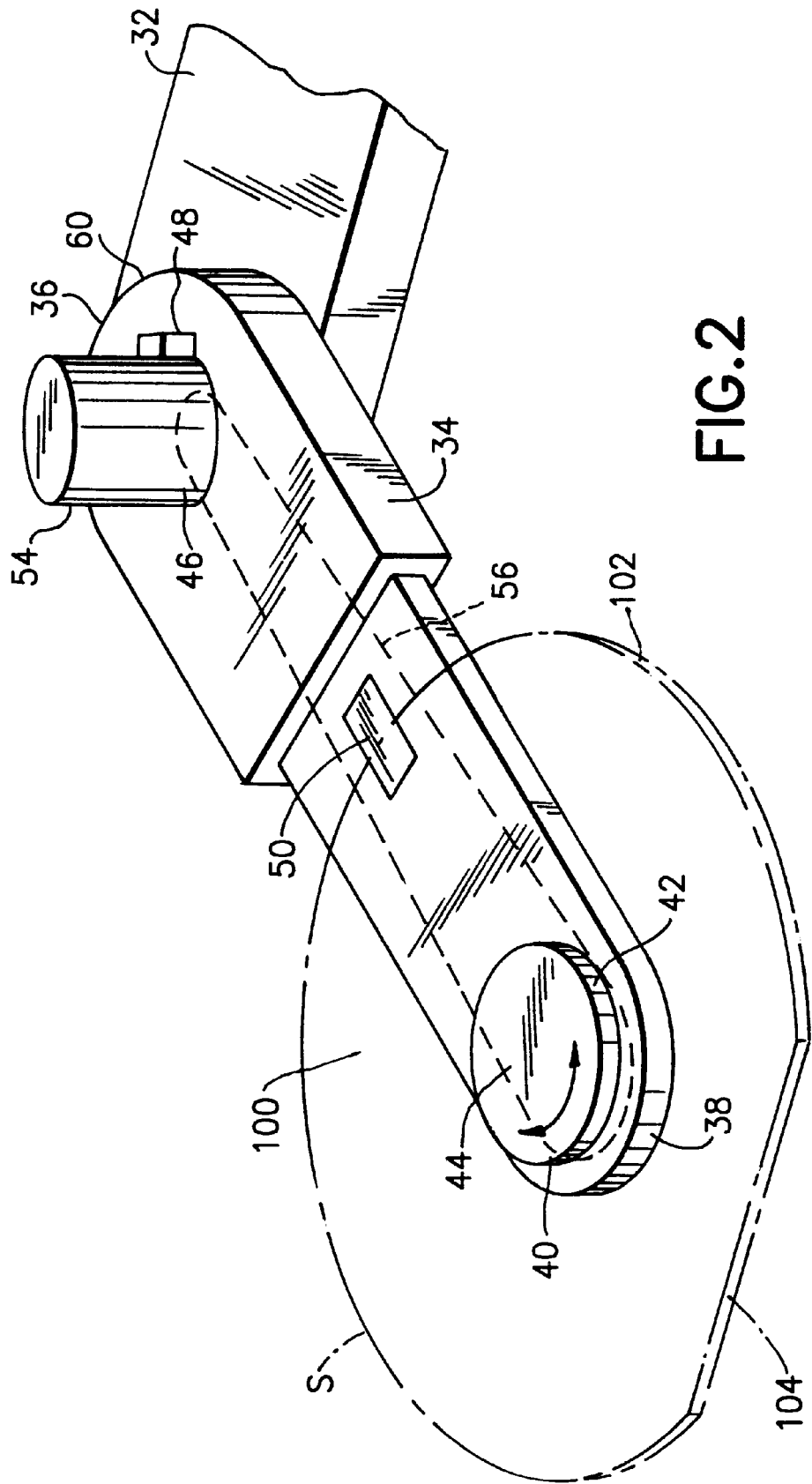
FIG. 2 is a partial perspective view of a robot transport arm of the apparatus shown in FIG. 1.

Referring also to FIG. 2, the extended wrist 34 is articularly mounted at its proximal end 36 to the forearm 32. The wrist 34 has an end effector 40 at its distal end 38. The end effector 40 is used to capture a substrate S and hold the substrate to the wrist 34 when moving the substrate. The arm assembly 25 is articulated to insert the end effector 40 into a cassette 26 to capture the substrate thereon. With the substrate held by the end effector 40, the arm assembly 25 is articulated to withdraw the substrate from the corresponding cassette 26. The robot 24 is then moved by traversing the car 22 to an appropriate position. The transport arm assembly is also again articulated to insert the end effector 40 with the substrate thereon into a load lock 12 and the substrate is released from the hold of the end effector 40. The above sequence is reversed when returning the substrate from the load lock 12 to a cassette.

The apparatus 10 has a substrate aligner adapted to align the substrate orientation relative to the arm assembly 25 while the substrate is being moved by the arm assembly 25 between the cassettes 26 and the load locks 12. The substrate aligner 42 includes a rotatable surface 44, a drive system 46, an encoder 48 and a sensor 50. The substrate aligner is controlled by a computer controller 52 (see FIG. 1). The rotatable surface 44 is incorporated into the end effector 40 and supports the substrate when it is held by the end effector 40 as shown in FIG. 2. In the preferred embodiment, the rotatable surface 44 forms a rotatable vacuum chuck which is part of the end effector 40. In alternate embodiments, the rotatable surface may have any other suitable form adapted to fixedly hold the substrate.

The drive system 46 is used to rotate the rotatable surface 44. The drive system 46 comprises a motor 54 and transmission 56 connecting the motor 54 to the rotatable surface 44, to rotate the surface 44. In the preferred embodiment, the motor 54 is a servomotor. The motor 54 is located at the joint 60 between wrist 34 and the forearm 32. The transmission 56 which transfers the power from the motor 54 to the rotatable surface 44 is a substantially zero slip belt transmission, such as a toothed belt. In alternate embodiments, any suitable motor and transmission combination may be used to rotate the rotatable surface 44. For example, the motor may directly drive the rotatable surface without a belt or shaft transmission. Alternatively, the transmission may include a hydraulic drive system.

The encoder 48 is used to determine the rotational position of the rotatable surface 44. In the preferred embodiment the encoder 48 is mounted on the motor 54. Any suitable type of motor encoder may be used. In alternate embodiments the encoder may be mounted at the rotatable surface 44, or there may not be an encoder. The sensor 50 is mounted on the wrist 34 to detect the position of the substrates held by the end effector 40. The sensor 50 is located on the wrist so that, when the substrate is held by the rotatable surface 44, a portion of the substrate can be located over the sensor 50.

The substrate S shown in FIG. 2 is a semiconductor wafer 100. As is standard in the art, the wafer 100 has a general circular outer edge perimeter 102 and an irregular section 104 at the outer edge perimeter. As is known in the art, semiconductor wafers have a surface structure orientation that sometimes needs to be aligned or precisely located in a substrate processing chamber in order to produce a desired result. It is also known in the art to spin wafers in order to find their center. In the past, wafers have been provided with a flat or notch on their perimeter edge in order to align the wafer, such as seen in U.S. Pat. No. 5,497,007. However, such alignment took place on an aligner device stationarily fixed relative to a frame of the substrate processing device or atmospheric substrate loading apparatus. Thus, the wafer had to be moved to and removed from a separate aligner station in order to align the wafer. This obviously took additional time. The present invention uses an "on the fly" method of aligning the surface structure orientation of the substrate while the substrate is being moved by the robot 24. The irregular section 104 is located at a precise location on the wafer 100 relative to the surface structure orientation. Thus, determining the position of the irregular section 104 indicates the position of the surface structure orientation.

When the robot 24 picks up the wafer 100 it holds the wafer to the end effector 40 by a vacuum grip. The computer controller 52 then signals the motor 54 to drive the chuck 44 which, in turn, rotates the wafer 100 with the chuck 44. As the wafer 100 rotates the irregular section 104 goes in and out of registry with the sensor 50. The sensor 50 is preferably a CCD or analog optical edge detector sensor that can sense when the irregular section 104 passes by the sensor. In an alternate embodiment the sensor could be an analog capacitance sensor. Signals from the sensor 50 are transmitted back to the computer controller 52. Based upon these signals, the computer controller 52 determines the position of the irregular section 104 and instructs the motor 54 to move to a desired position to locate the irregular section 104 at a precise location on the wrist 34. This aligns the surface structure of the wafer 100 on the wrist 34 for precise positioning into the target location. This alignment method occurs during the process of moving the wafer by the robot 24 between two locations without moving the wafer off of the robot 24 or end effector 40. Thus, the surface structure orientation of the wafer 100 can be aligned faster than with the prior art separate aligner stations. The sensor 50 signals the rotational position of the wafer 100 to the computer controller 52 which controls the rotation of the rotational surface 44 to establish a particular alignment of the wafer 100 relative to the wrist 34. Preferably, the signals from the sensor 50 are used in conjunction with signals from the encoder 48 relaying data on the rotational position of the rotatable surface 44 to achieve precise control of the substrate alignment. In addition to surface structure orientation alignment, the signals from the edge detector sensor 50 can be used by the computer controller 52 to locate the center of the wafer 100 relative to the wrist 34 and control movement of the robot 24 to locate the center of the wafer at a precise location in the target location. The present invention can be used as an alternative to a separate aligner station or in addition to a separate aligner station. When used in addition to a separate aligner station, a first substrate can be aligned in the separate aligner station while the robot also aligns a second substrate thereon. Additional alignment systems could also be used in conjunction with the present invention, such as those disclosed in U.S. Pat. Nos. 5,563,798; 5,537,311; and 5,483,138. The present invention could also be used on a robot with more than one end effector. On such a multiple end effector robot the aligner could be used on all the end effectors or less than all the end effectors. The aligner system of the present invention could also be incorporated into other types of end effectors. For example, an end effector without vacuum holding of the substrate could be used.

The present invention allows "on the fly" alignment of a substrate while it is moved between the cassette 26 and the load locks 12. Processes applied in the processing device 14 may be alignment critical requiring that the substrate be placed in the processing chamber (not shown) in a particular orientation. In the prior art, changing alignment of the substrate required an intermediate transfer to an alignment station. The present invention eliminates the intermediate step of transferring the substrate to the alignment station. In the present invention, the substrate is removed from the cassette 26, moved to the load locks 12 and aligned as required while being moved. Elimination of the intermediate step of transporting the substrate to an aligning module, eliminates delays induced by this additional step and results in an increase in substrate throughput that one robot may handle in a given amount of time. In alternate embodiments, the substrate aligner may be on a transport arm of a robot in the processing device 14.

It should be understood that the foregoing description is only illustrative of the invention. Various alternatives and modifications can be devised by those skilled in the art without departing from the present invention. Accordingly, the present invention is intended to embrace all such alternatives, modifications and variances which fall within the scope of the appended claims.

What is claimed is:

1. A substrate transport apparatus comprising:

a robot transport arm having an end effector to hold a substrate; and means for aligning the substrate relative to the transport arm while the substrate is being held by the end effector, the means for aligning the substrate comprising a sensor located on the robot transport arm, wherein the sensor senses a predetermined characteristic of the substrate held by the end effector.

2. A substrate transport apparatus as in claim 10, wherein the end effector comprises a rotatable chuck for supporting the substrate thereon.

3. A substrate transport apparatus as in claim 2, wherein the means for aligning the substrate relative to the end effector, comprise means for rotating the chuck supporting the substrate.

4. A substrate transport apparatus as in claim 3, wherein the means for rotating the chuck comprise a servomotor with a transmission to drive the chuck.

5. A substrate transport apparatus as in claim 3, further comprising means for relating pivotal position of the substrate to rotational position of the chuck, the means for relating comprises an encoder to determine a rotational position of the chuck, the encoder co-acting with the sensor that senses an edge of the substrate held by the end effector.

6. A method for moving aligning a substrate when the substrate is being moved from a first location to a second location comprising steps of:

capturing the substrate at the first location with a robot transport arm;

moving the substrate linearly with the robot transfer arm from the first location to the second location; and aligning the substrate by rotating the substrate relative to the robot transport arm when the robot transport arm is linearly moving the substrate relative to the first location.

7. A method for aligning a substrate as in claim 6, wherein the step of moving the substrate comprises taking the substrate out of a first chamber at the first location.

8. A method for aligning a substrate as in claim 6, wherein the step of moving the substrate comprises inserting the substrate into a second chamber at the second location.

9. A substrate transport apparatus comprising:

a robot transport arm having an end effector to hold a substrate;

means for rotatably moving the substrate on the end effector when the substrate is held by the end effector;

a computer controller connected to the moving means to control rotation of the substrate on the end effector; and a sensor located on the robot transport arm to sense rotational position of the substrate on the end effector.

10. A substrate transport apparatus as in claim 9 further comprising an encoder signaling rotation of the substrate on the end effector to the computer controller.

11. A substrate transport apparatus as in claim 9 wherein the sensor signals rotational position of the substrate on the end effector to the computer controller.

* * * * *